(12) United States Patent
Holzmann et al.

(10) Patent No.: US 10,404,292 B2
(45) Date of Patent: Sep. 3, 2019

(54) SIGNAL RECEIVING APPARATUS AND SIGNAL RECEIVING METHOD, SIGNAL GENERATING APPARATUS AND SIGNAL GENERATING METHOD

(71) Applicant: Rohde & Schwarz GmbH & Co. KG, Munich (DE)

(72) Inventors: Gottfried Holzmann, Zorneding (DE); Martin Roth, Starnberg (DE); Martin Oetjen, Groebenzell (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/856,821

(22) Filed: Dec. 28, 2017

(65) Prior Publication Data
US 2019/0207632 A1    Jul. 4, 2019

(51) Int. Cl.
*H04B 1/00* (2006.01)
*H03D 1/22* (2006.01)

(52) U.S. Cl.
CPC ............. *H04B 1/0032* (2013.01); *H03D 1/22* (2013.01); *H04B 1/0014* (2013.01)

(58) Field of Classification Search
CPC .... H04B 1/406; H04B 1/0007; H04B 1/0014; H04B 2201/70716
See application file for complete search history.

(56) References Cited

U.S. PATENT DOCUMENTS 9,912,348 B1 * 3/2018 Baringer .............. G05D 1/0088

* cited by examiner

*Primary Examiner* — Keith Ferguson
(74) *Attorney, Agent, or Firm* — Shumaker & Sieffert, P.A.

(57) ABSTRACT

Techniques related to signal processing include setting up a first operation mode or a second operation mode. In the first operation mode: providing a first analog signal to a first A/D converter by a first switch and a second analog signal to a second A/D by second switch, and converting the first analog signal to a first digital signal by the first A/D and the second analog signal to a second digital signal by the second A/D. In the second operation mode: demodulating a third analog signal to an in-phase signal and a quadrature signal by an I-Q-demodulator, providing the in-phase signal to the first A/D by the first switch, providing the quadrature signal to a second A/D by second switch, converting the in-phase signal to a third digital signal by the first A/D, and converting the quadrature signal to a fourth digital signal by the second A/D.

18 Claims, 3 Drawing Sheets

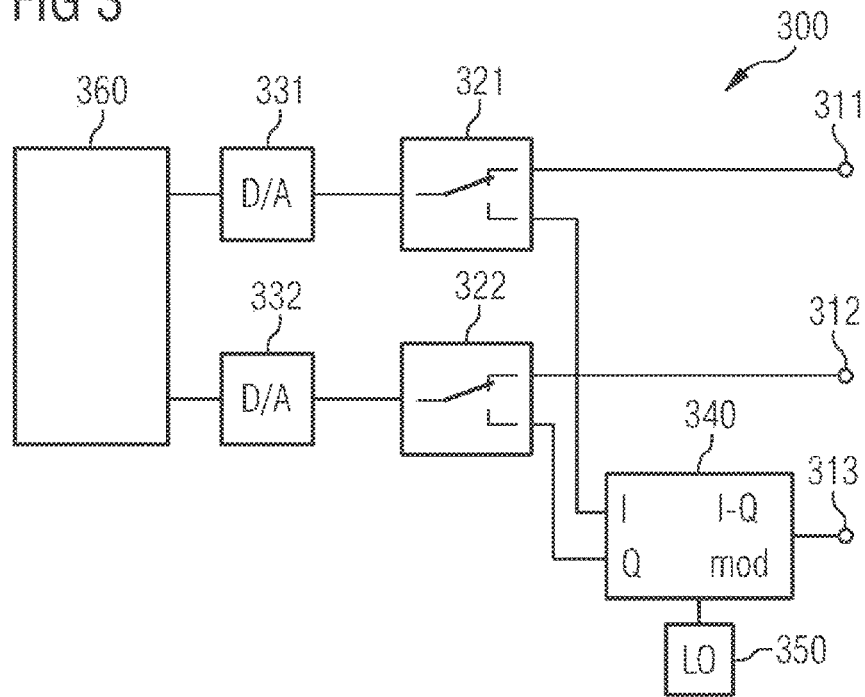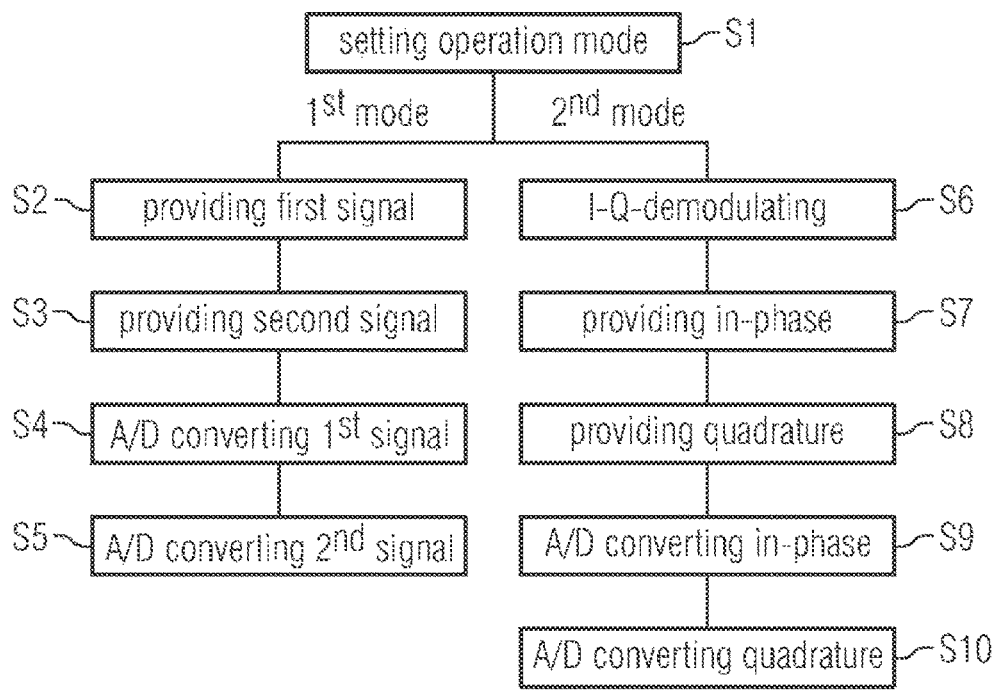

SIGNAL RECEIVING APPARATUS AND SIGNAL RECEIVING METHOD, SIGNAL GENERATING APPARATUS AND SIGNAL GENERATING METHOD

TECHNICAL FIELD

The present invention relates to a signal receiving apparatus and signal receiving method. The present invention further relates to a signal generating apparatus and signal generating method.

BACKGROUND

Although applicable in principal to any radio frequency system, the present invention and its underlying problem will be hereinafter described in combination with testing of a wireless communication system.

In modern wireless communication systems the amount of data during a communication between single devices increases. For this purpose, the bandwidth and the frequency of the radio frequency signals for communication increases, too.

For testing such communication systems, appropriate hardware for high-frequency applications and the broadband applications is required. However, appropriate hardware components such as broadband analogue to digital converters or digital to analog converters are expensive. Thus, the costs for an appropriate test hardware are very high.

Against this background, the problem addressed by the present invention is to provide an apparatus and method for receiving signals, in particular high-frequency and/or broadband signals which can be realized with lower costs. Moreover, the present invention aims to provide an apparatus and method for generating signals, in particular high-frequency and/or broadband signals which can be generated by hardware of lower costs.

SUMMARY

The present invention solves this object by a signal receiving apparatus with the features of claim 1, a signal receiving method with the features of claim 6, a signal generating apparatus with the features of claim 11 and a signal generating method with the features of claim 15.

According to a first aspect, a signal receiving apparatus is provided. The signal receiving apparatus comprises a first signal input terminal for receiving a first analogue signal, a second signal input terminal for receiving a second analogue signal, and a third signal input terminal for receiving a third analogue signal. The apparatus further comprises a first analogue to digital converter having an analogue input port and a digital output port. The first analogue to digital converter is adapted to convert an analogue signal received at the analogue input port to a digital signal and provide the digital signal to the digital output port, and a second analogue to digital converter having an analogue input port and a digital output port. The second analogue to digital converter is adapted to convert an analogue signal received at the analogue input port to a digital signal and provide the digital signal to the digital output port. Further, the apparatus comprises an I-Q-demodulator having an input port, an in-phase-output port and a quadrature output port. The I-Q-demodulator is adapted to demodulate a signal received at the input port of the I-Q-demodulator to an in-phase signal and a quadrature signal and provide the in-phase signal to the in-phase-output port and the quadrature signal to the quadrature-output port. The apparatus further comprises a first switch comprising a first input port, a second input port and an output port, wherein the first input port of the first switch is electrically connected to the first signal input terminal, and the second input port of the first switch is electrically connected to the in-phase output port of the I-Q-demodulator, and the output port of the first switch is electrically connected to the analogue input port of the first analogue to digital converter. The apparatus comprises further a second switch comprising a first input port, a second input port and an output port, wherein the first input port of the second switch is electrically connected to the second signal input port, and the second input terminal of the second switch is electrically connected to the quadrature-output port of the I-Q-demodulator, and the output port of the second switch is electrically connected to the analogue input port of the second analogue to digital converter. In a first operation mode of the signal receiving apparatus, the first switch is adapted to electrically connect the first input port of the first switch to the output port of the first switch, and the second switch is adapted to electrically connect the first input port of the second switch to the output port of the second switch. In a second operation mode of the signal receiving apparatus, the first switch is adapted to electrically connect the second input port of the first switch to the output port of the first switch, and the second switch is adapted to electrically connect the second input port of the second switch to the output port of the second switch.

According to a second aspect, a signal receiving method is provided. The method comprises a step of setting up a first operation mode or a second operation mode. Further, the method performs in the first operation mode the steps of providing a first analogue signal to a first analogue to digital converter by a first switch; providing a second analogue signal to a second analogue to digital converter by second switch; converting the first analogue signal to a first digital signal by the first analogue to digital converter; and converting the second analogue signal to a second digital signal by the second analogue to digital converter. Further, the method performs in the second operation mode the steps of demodulating a third analogue signal to an in-phase signal and a quadrature signal by an I-Q-demodulator; providing the in-phase signal to the first analogue to digital converter by the first switch; providing the quadrature signal to a second analogue to digital converter by second switch; converting the in-phase signal to a third digital signal by the first analogue to digital converter; and converting the quadrature signal to a fourth digital signal by the second analogue to digital converter.

According to a third aspect, a signal generating apparatus is provided. The signal generating apparatus comprises a first signal output terminal, a second signal output terminal, and a third signal output terminal. The apparatus further comprises a first digital to analogue converter having a first digital input port and an analogue output port. The first digital to analogue converter is adapted to convert a digital signal received at the digital input port of the first digital to analogue converter to a first analogue signal and provide the first analogue signal to the analogue output port of the first digital to analogue converter. The apparatus further comprises a second digital to analogue converter having a digital input port and an analogue output port. The second digital to analogue converter is adapted to convert a digital signal received at the digital input port of the second digital to analogue converter to a second analogue signal, and provide the second analogue signal to the second analogue output port of the second digital to analogue converter. The signal generating apparatus further comprises an I-Q-modulator having an in-phase input port for receiving an analogue in-phase signal, an quadrature input port for receiving and analogue quadrature signal, and an output port electrically connected to the first signal output terminal, wherein the I-Q-modulator is adapted to combine the received in-phase signal and received quadrature signal and provide the combined signal to the output port. Further, the signal generating apparatus comprises a first switch comprising an input port, a first output port and a second output port, wherein the input port of the first switch is electrically connected to the analogue output port of the first digital to analogue converter, the first output port of the first switch is electrically connected to the first signal output terminal, and the second output port of the first switch is electrically connected to the in-phase input port of the I-Q-modulator. The apparatus further comprises a second switch comprising an input port, a first output port and a second output port, wherein the input port of the second switch is electrically connected to the analogue output port of the second digital to analogue converter, the first output port of the second switch is electrically connected to the second signal output terminal, and the second output port of the second switch is electrically connected to the quadrature port of the I-Q-modulator. In a first operation mode of the signal generating apparatus, the first switch is adapted to electrically connect the input port of the first switch to the first output port of the first switch, and the second switch is adapted to electrically connect the input port of the second switch to the first output port of the second switch. In a second operation mode of the signal generating apparatus, the first switch is adapted to electrically connect the input port of the first switch to the second output port of the first switch, and the second switch is adapted to electrically connect the input port of the second switch to the second output port of the second switch.

According to a fourth aspect, a signal generating method is provided. The method comprises the steps of setting up a first operation mode or a second operation mode; converting a first digital signal to a first analogue signal by a first digital to analog converter; and converting a second digital signal to a second analogue signal by a second digital to analog converter. In the first operation mode, the method comprises the steps outputting the first analogue signal by the first switch; and outputting the second analogue signal by the second switch. In the second operation mode, the method comprises the steps of providing the first analogue signal to an in-phase input of an I-Q modulator by the first switch; providing the second analogue signal to a quadrature input of an I-Q modulator by the second switch; and mixing the in-phase signal and the quadrature signal by the I-Q-modulator and outputting the mixed signal.

As already explained above, devices dealing with high-frequency broadband signals usually require elements which can deal with broadband signals. At least some of these elements are expensive. Furthermore, it is very difficult to achieve a precise tuning of the respective elements dealing with high-frequency broadband signals. In particular, high-frequency broadband analogue to digital converter and digital to analogue converter are components which are difficult to produce and thus, these components are expensive.

The present invention therefore provides a configuration for measuring and/or generating high frequency broadband signals. It is for this purpose that the present invention provides two separate operation modes. In a first operation mode, a measurement or signal generating of two independent signal paths may be performed separately. In addition, a further operation mode is provided wherein a signal is separated to an in-phase component and a quadrature component. Accordingly, the in-phase component and the quadrature component can be processed separately.

In this way, it is possible to perform the measurement of a signal by measuring the in-phase and the quadrature component separately and subsequently combining the in-phase and the quadrature component. Accordingly, the in phase and the quadrature component can be measured separately, for instance by two analogue to digital converters having a reduced sampling rate. Thus, the respective analogue to digital converters require a reduced bandwidth. Consequently, the analogue to digital conversion can be performed by simpler analogue to digital converters having a reduced bandwidth.

In the same way, high-frequency signals can be generated by a signal generator employing two operation modes. In a first operation mode, two independent signals can be generated by two analogue to digital converters, each converting digital data to an analogue signal, respectively, wherein the two analogue signals are separately outputted. Furthermore, in a second operation mode, it may be possible to provide two interrelated signals, wherein the two signals relate to an in-phase and a quadrature component of the single signal. Accordingly, the two signals may be combined by an I-Q-modulator to a single signal, which can be output. In this way, the output signal may have a larger bandwidth than the in-phase and the quadrature component. Accordingly, the respective digital to analogue converters only require a reduced broadband with respect to the output signal. Thus, it is possible to generate a wide frequency signal with a high bandwidth by digital to analogue converters having only a small bandwidth.

The I-Q-demodulator may be any kind of demodulator for separating a signal into an in-phase component and a quadrature component of a signal. For example, the I-Q-demodulator may comprise first elements, e.g. a first mixer, for extracting the in-phase component of the signal, and second elements, e.g. a phase shifter and a second mixer, for extracting the quadrature component of the signal. It is understood, that in the I-Q-demodulator may also comprise additional and/or other elements for separating the signal into an in-phase component and quadrature component.

Accordingly, the I-Q-modulator may be any kind of modulator for combining an in-phase component and a quadrature component of a signal to a common, single signal. For example, the I-Q-modulator may comprise a number of mixers and phase shifting elements for combining the in-phase component and the quadrature component of the signal to a common signal.

The switches for switching the signals may be any kind of appropriate switches for switching of the respective high-frequency signals. For example, the switches may be mechanical switches or electronic switches, e.g. semiconductor switches. It is understood, that any other kind of switches for switching the high-frequency signals may be possible, too.

The analogue to digital converters may be any kind of component for converting the respective high-frequency analogue signals to digital signals. The analogue to digital converters may comprise components such as filters, amplifiers, attenuators, etc. However, it is understood, that the analogue to digital converters may also comprise any kind of appropriate further components. The converted digital signal may be provided as digital data by a digital interface, for example a serial or parallel data interface. For example, any kind of digital data bus may be used for forwarding the digital data.

Accordingly, the digital to analogue converters may be any kind of component for converting digital data to a corresponding high-frequency analogue signal. The digital two analogue converters may comprise components such as filters, amplifiers, attenuators, etc. However, it is understood, that the analogue to digital converters may also comprise any kind of appropriate further components. The digital data may be provided as digital data by a digital interface, for example a serial or parallel data interface. For example, any kind of digital data bus may be used for receiving the digital data.

With the signal receiving apparatus and method and the signal generating apparatus and method according to the present invention, it is possible to receive/generate high-frequency signals having a relative wide bandwidth by electronic components having a limited bandwidth. By separating a broadband signal into an in-phase component and a quadrature component and processing the in-phase component and the quadrature component separately, the respective processing can be performed by means of components having smaller bandwidth. Thus, such components are more reliable and less expensive. Accordingly, the reliability of the signal receiving and signal generating can be increased and the costs for building up the respective devices can be decreased.

Further embodiments of the present invention are subject of the further subclaims and of the following description, referring to the drawings.

In a possible embodiment, the signal receiving apparatus may comprise a signal processor. The signal processor may be adapted to process the digital output of the first analogue to digital converter and the digital output of the second analogue to digital converter separately in the first operation mode of the signal receiving apparatus. Further, the signal processor may be adapted to combine the digital output of the first analogue to digital converter and the digital output of the second analogue to digital converter in the second operation mode of the signal receiving apparatus.

The signal processor may e.g. comprise a general purpose processor with corresponding instructions. Further, the signal processor may comprise interfacing elements that are coupled to the processor, receive the digital signals from the analogue to digital converters and provide the received signals to the processor.

The signal processor may comprise hardware elements, like e.g. a processing unit. However, the signal processor may also be software implemented at least in part. The instructions for operating the signal processor may be stored in a memory that is coupled to a general purpose processor, e.g. via a memory bus. The processor may further execute an operating system that loads and executes the instructions. The processor may e.g. be an Intel processor that runs a Windows or Linux operating system that loads and executes the instructions. In another embodiment, the processor may be a processor of a measurement device that may e.g. run an embedded operating system that loads and executes the first instructions.

In a possible embodiment, a same sampling rate is applied to the first analogue to digital converter and the second analogue to digital converter in the second operation mode of the signal receiving apparatus. The sampling of the first of the digital converter and the second analogue to digital converter may be synchronized with each other.

Accordingly, when a signal is separated into an in-phase component and a quadrature component, the respective in-phase component and the quadrature component of the signal may be sampled by two separate analogue to digital converters. By applying the same sampling rate, the further processing of the digital data, in particular a successively performed combining of the digital signals can be performed easily. By synchronising the respective analogue to digital converters, it is possible that the in-phase component of the signal and the quadrature component of the signal are sampled at corresponding points of times, and thus, the respective sampled digital data of the in-phase component of the signal and the quadrature component of the signal correspond to each other, respectively.

In a possible embodiment, the signal receiving apparatus comprises a local oscillator. The local oscillator may be adapted to provide a local frequency to the I-Q-demodulator. The I-Q-demodulator may be adapted to demodulate the signal received at the input port of the I-Q-demodulator based on the provided local frequency.

By applying a frequency mixing of the input signal of the I-Q-demodulator and the local frequency, it is possible to mix down Sedona the frequency of the in-phase component and the quadrature component of the signal to a lower frequency accordingly. In this way, the successive processing, in particular the successive analogue to digital conversion can be performed in the respective lower frequency band.

In a possible embodiment, the signal receiving apparatus comprises a first frequency mixer for mixing a first radio frequency signal at a first local frequency and outputting the mixed signal to the first signal input terminal. Further, the signal receiving apparatus may comprise a second frequency mixer for mixing a second radio frequency signal at a second local frequency and outputting the mixed signal to the second signal input terminal.

The mixers may be any kind of appropriate frequency mixer for mixing two input signals. By mixing the input signal with a local frequency, the frequency mixer provides an output signal comprising a signal component wherein the input signal is reduced by the frequency of the local frequency. Additionally, the output signal comprises a signal component wherein the frequency of the input signal is increased by the local frequency. By applying a successive frequency filtering, the lower frequencies the signal can be extracted, for instance by a low pass filter. Thus, the successive analogue to digital conversion can be applied in a lower frequency range.

In a possible embodiment, the signal generating apparatus comprises a signal processor. The signal processor may be adapted to provide a first digital signal to the first digital to analogue converter and a second digital signal to the second digital to analogue converter. In the second operation mode of the signal generating apparatus, the first digital signal may be an in-phase-component of a signal to be outputted, and the second digital signal may be a quadrature component of the signal to be outputted. Furthermore, in the first operation mode, the first digital signal and the second digital signal may be independent signal.

The signal processor in this embodiment may e.g. comprise a general purpose processor with corresponding instructions. Further, the signal processor may comprise interfacing elements that are coupled to the processor, which provide the digital signals of the process or to the digital to analogue converters.

The signal processor may comprise hardware elements, like e.g. a processing unit. However, the signal processor may also be software implemented at least in part. The instructions for operating the signal processor may be stored in a memory that is coupled to a general purpose processor, e.g. via a memory bus. The processor may further execute an operating system that loads and executes the instructions. The processor may e.g. be an Intel processor that runs a Windows or Linux operating system that loads and executes the instructions. In another embodiment, the processor may be a processor of a measurement device that may e.g. run an embedded operating system that loads and executes the first instructions.

In a possible embodiment, the first digital to analogue converter and the second digital to analogue converter are synchronized with each other.

By synchronising the first and second digital to analogue converters, the respective digital to analogue converters may output the analogue signals at corresponding points of times. For this purpose, the first and the second digital to analogue converter may be communicatively coupled with each other in order to provide an appropriate synchronisation signal.

In a possible embodiment the signal generating apparatus comprises a local oscillator for providing a local frequency to the I-Q-modulator. The I-Q-modulator may be adapted to modulate the signals received at the in-phase port and the quadrature port of the I-Q-modulator based on the provided local frequency.

Accordingly, the in-phase component and the quadrature component of a signal may be combined to a single, common signal and the frequency of the combined signal may be increased via the frequency of the provided local frequency. In this way, is possible to provide a broadband high-frequency signal by means of components having a lower frequency range.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which:

FIG. 3 shows a block diagram of embodiment of a signal generating apparatus according to the present invention;

FIG. 4 shows a block diagram of an embodiment of a signal receiving method according to the present invention.

Figure 1:
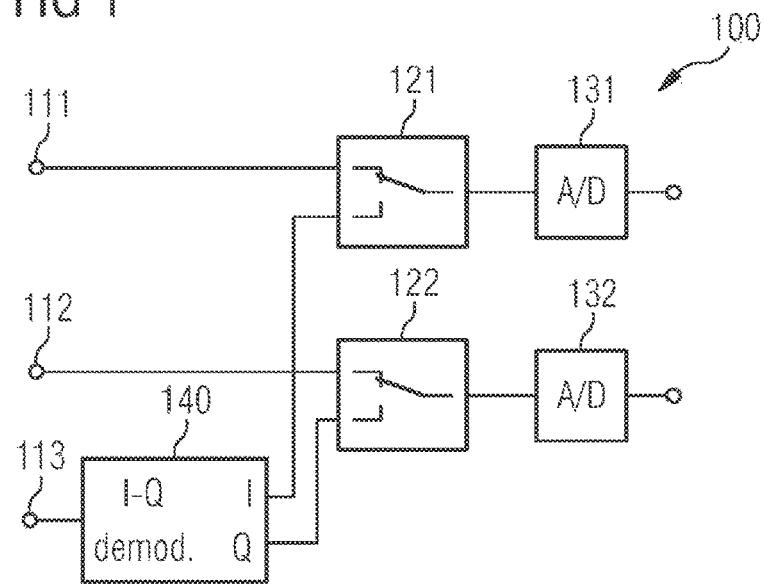
FIG. 1 shows a block diagram of an embodiment of a signal receiving apparatus according to the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

FIG. 1 shows a block diagram of a signal receiving apparatus 100. The signal receiving apparatus 100 comprises signal input terminals 111, 112 and 113. The first signal input terminal 111 is adapted to receive a first analogue input signal. The second signal input terminal 112 is adapted to receive a second analogue input signal. The third signal input terminal 113 is adapted to receive a third analogue input signal. In particular, the third analogue input signal may be with a bandwidth which is larger than the bandwidth of the first or the second analogue input signal.

The signal receiving apparatus 100 further comprises a first switch 121 and a second switch 122, a first analogue to digital converter 131 and a second analogue to digital converter 132. Further, the signal receiving apparatus 100 comprises an I-Q-demodulator 140.

A first input port of the first switch 121 is electrically connected with the first signal input terminal 111. Accordingly, the first input port of the second switch 122 is electrically connected with the second signal input terminal 112.

An input port of the I-Q-demodulator 140 is electrically connected with the third signal input terminal 113. An in-phase output port of the I-Q-demodulator 140 is electrically connected with a second input port of the first switch 121, and a quadrature output port of the I-Q-demodulator 140 is electrically connected with the second input port of the second switch 122.

The output port of the first switch 121 is electrically connected with an input port of the first analogue to digital converter 131. The output port of the second switch 122 is electrically connected to with an input port of the second analogue to digital converter 132.

In a first operation mode of the signal receiving apparatus 100, the first switch 121 connects the first input port with the output port of the first switch 121, and the second switch 122 connects the first input port with the output port of the second switch 122. In this way, the first analogue signal provided at the first signal input terminal 111 is provided to the input port of the first analogue to digital converter 131. Accordingly, the second analogue signal provided at the second signal input terminal 112 is provided to the input port of the second analogue to digital converter 132. In this way, the first analogue to digital converter 131 converts the first analogue signal to a corresponding first digital signal and outputs the first digital signal, and the second analogue to digital converter 132 converts the second analogue signal to a corresponding second digital signal and outputs the second digital signal. In this operation mode, the bandwidth of the first and the second analogue to digital converters 131 and 132 have to be adapted to the bandwidth of the first and the second analogue signal which are input at the first and the second signal input terminals 111 and 112.

In a second operation mode of the signal receiving apparatus 100, the first switch 121 connects the second input port with the output port of the first switch 121, and the second switch 122 connects the second input port with the output port of the second switch 122. In this way, the signal which is input at the third signal input terminal 113 is separated to an in-phase component signal and a quadrature component signal by the I-Q-demodulator 140. The in-phase component signal which is output at the in-phase port of the I-Q-demodulator 140 is the forwarded via the first switch 121 to the first analogue to digital converter 131. Accordingly, the quadrature component signal which is output at the quadrature port of the I-Q-demodulator 140 is forwarded via the second switch 122 to the second analogue to digital converter 132. Thus, the first analogue to digital converter 131 outputs a digital signal which corresponds to the in-phase signal of the input signal of the third signal input terminal 113, and the second analogue to digital converter 132 outputs a digital signal which corresponds to the quadrature signal of the input signal of the third signal input terminal 113. Accordingly, each analogue to digital converter 131, 132 may require a reduced bandwidth, since the third analogue signal from the third signal input terminal 130 is separated into two components which are sampled separately by the first and the second analogue to digital converters 131, 132.

Subsequently, the digital data provided by the first analogue to digital converter 131 and the second analogue to digital converter 132 may be combined in order to obtain digital data corresponding to the respective third analogue signal which has been provided at the certain signal input terminal 113.

In order to obtain timely corresponding digital data for the in-phase component signal and the quadrature component signal of the insert analogue signal, the first analogue to digital converter 131 and the second analogue to digital converter 132 may be operated with a same sampling rate. In particular, it may be possible to synchronise the sampling of the first analogue to digital converter 131 and the second analogue to digital converter 132. For example, the first and the second analogue to digital converters 131, 132 may be communicatively coupled for synchronising the sampling of the two analogue to digital converters 131, 132.

Figure 2:
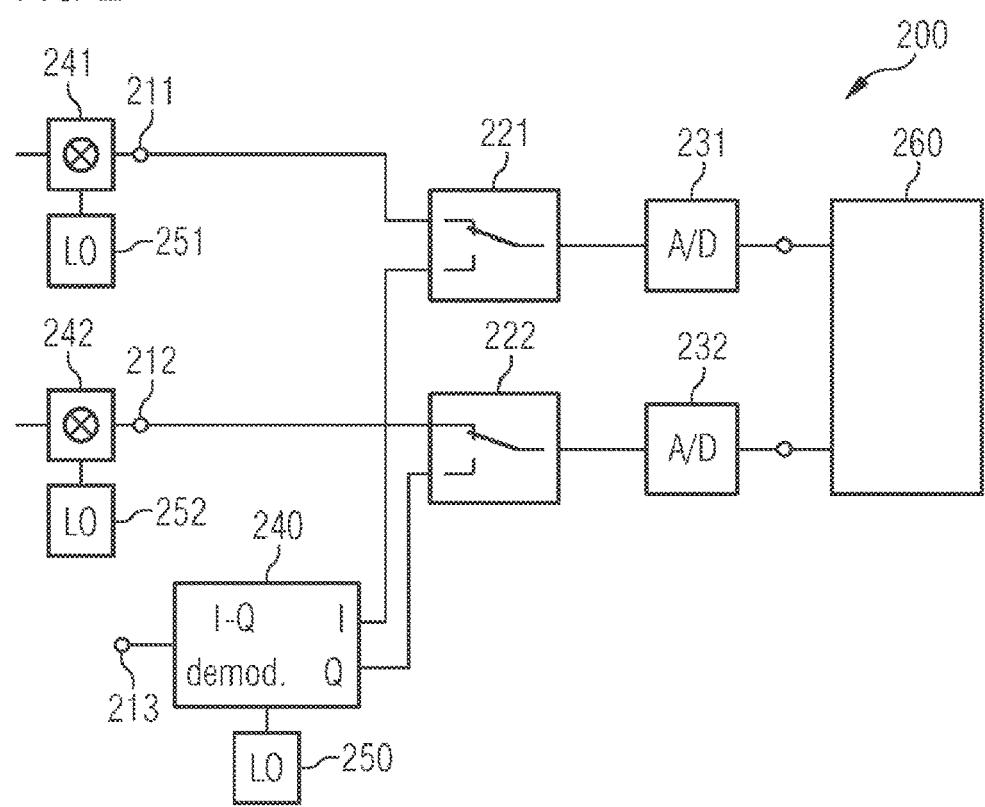
FIG. 2 shows a block diagram of another embodiment of a signal receiving according to the present invention.

FIG. 2 shows a block diagram of a signal receiving apparatus 200 according to a further embodiment. The signal receiving apparatus 200 mainly corresponds to the signal receiving apparatus 100 according to the previous embodiment which has been already described in connection with FIG. 1. Thus, the explanation of the signal receiving apparatus 100 according to FIG. 1 also applies to the signal receiving apparatus 200 according to FIG. 2.

As can be seen in FIG. 2, the signal receiving apparatus 200 further may comprise a signal processor 260 for further processing the digital signals output by the first analogue to digital converter 231 and the second analogue to digital converter 232. In the first operation mode, the signal processor 260 may separately process the digital data provided from the first analogue to digital converter 231 and the second analogue to digital converter 232. In particular, the digital signals may be even sampled and processed with different sampling rates. In the second operation mode, signal processor 260 may receive the digital data provided by the first and the second analogue to digital converter 231 and 232 together. The signal processor 260 may further combine the digital data from the first and the second analogue to digital converters 231, 232 in order to obtain a single digital signal relating to the corresponding of the analogue signal provided at the signal input terminal 213. It is understood, that the signal processor 260 may also perform any further processing on the received digital data from the first and the second analogue to digital converters 231, 232. For example, the signal processor may apply a digital filtering, frequency analysis, or the signal processor may extract any further digital information from the digital data provided by the first and the second analogue to digital converters 231, 232.

As can be further seen in FIG. 2, the I-Q-demodulator 240 may be connected with a local frequency generator 250. The local frequency generator 250 may provide a predetermined frequency to the I-Q-demodulator 240. The local frequency generator 250 may provide a predetermined fixed frequency. However, the local frequency generator 250 may also be a tuneable frequency generator for providing an adjustable frequency to the I-Q-demodulator 240. In this way, the third analogue input signal provided at the third signal input terminal 113 may be mixed with the provided local frequency from the local frequency generator 250. By mixing the input signal with the local frequency, an output signal can be obtained having a frequency of a difference between the third analogue input signal and the local frequency and a frequency of a sum of the third analogue input signal and the local frequency. Accordingly, the output signal can be filtered, in particular low-pass filtered, in order to obtain only the lower frequencies (corresponding to the difference between the third analogue input signal and the local frequency).

In order to separate the third analogue input signal into an in-phase component signal and a quadrature component signal, a first mixer of the I-Q-demodulator 240 may be provided with the local frequency, and a second mixer of the I-Q-demodulator 240 may be provided with local frequency which has been shifted by 90°. For this purpose, the I-Q-demodulator 240 may comprise further a phase shifting component for shifting the phase of the local frequency.

Furthermore, it may be also possible to apply a first frequency mixer 241 in the signal path before the first signal input terminal 211 and/or a second frequency mixer 242 in the signal path before the second signal input terminal 212. Accordingly, the first frequency mixer 241 and the second frequency mixer 242 may be provided with local frequencies from relating local oscillators 251, 2152. As illustrated in FIG. 2, the I-Q-demodulator 240 and/or the frequency mixer is 241, 242 may be provided with local frequencies from separate local frequency generators 250, 251, and 252. However, it is understood, that singer local frequency generator may be used for providing local frequencies to the first and the second frequency mixer 241, 242 or a single local frequency may be provided even to the I-Q-demodulator 240 and the first and the second frequency mixer is 241, 242.

FIG. 3 shows a block diagram of a signal generating apparatus 300. The signal generating apparatus 300 comprises a first signal output terminal 311, a second signal output terminal 312 and a third signal output terminal 313. The signal generating apparatus 300 further comprises a first digital anaLogue converter 331, a second digital to analogue converter 332, a first switch 321 and a second switch 322. Further, the signal generating apparatus 300 comprises an I-Q-modulator 340.

Additionally, the signal generating apparatus 300 may comprise a signal processor 360 for outputting a first digital signal and a second digital signal. The first digital to analogue converter 331 receives a digital signal, for instance a digital signal from signal processor 360, and the second digital to analogue converter 332 receives a further digital signal, for instance a further digital signal from signal processor 360.

The first digital to analogue converter 331 is connected to an input port of the first switch 321, and the second digital analogue converter 332 is connected to an input port of the second switch 322. Accordingly, the first digital to analogue converter 331 converts the received digital data to a corresponding analogue signal and provides the analogue signal to the input port of the first switch 321. The second digital analogue converter 332 converts the received digital data to a corresponding analogue signal and provides the analogue signal to the input port of the second switch 322.

A first output port of the first switch 321 is electrically connected to the first signal output terminal 311. The first output port of the second switch 322 is electrically connected to the second signal output terminal 312.

In a first operation mode of the signal generating apparatus 300, the first switch 321 electrically connects the input port of the first switch 321 with the first output port of the first switch 321. Thus, the analogue output port of the first digital to analogue converter 331 is electrically connected with the first signal output terminal 311. Accordingly, in the first operation mode of the signal generating apparatus 300, the second switch 322 electrically connects the input port of the second switch 322 with the first output port of the second switch 322. Thus, the analogue output port of the second digital to analogue converter 332 is electrically connected with the second signal output terminal 312.

The I-Q-modulator 340 comprises an in-phase input port and a quadrature input port. Further, the I-Q-modulator 340 comprises at least one output port. The in-phase input port of the I-Q-modulator 340 is electrically connected with a second output port of the first switch 321, and the quadrature input port of the I-Q-modulator 340 is electrically connected with the second output port of the second switch 322. The output port of the I-Q-modulator 340 is electrically connected with the third signal output terminal 313.

In a second operation mode of the signal generating apparatus 300, the first switch 321 electrically connects the input port of the first switch 321 with the second output port of the first switch 321. Further, the second switch 322 electrically connects the input port of the second switch 322 with the second output port of the second switch 322. Thus, the analogue output port of the first analogue to digital converter 331 is electrically connected with the in-phase input port of the I-Q-modulator 340. Accordingly, the analogue output port of the second analogue to digital converter 332 is electrically connected with the quadrature input port of the I-Q-modulator 340. Based on this configuration of the second operation mode, the I-Q-modulator 340 combines the analogue output signals of the first analogue to digital converter 331 and the second analogue to digital converter 332 to a single analogue signal. The combined single signal is output by the I-Q-modulator 340 and provided to the third signal output terminal 313.

The I-Q-modulator 340 may be further provided with a local frequency. This local frequency may be generated, for instance, by a local frequency generator 350. The local frequency generator 350 may output a predetermined fixed frequency. Alternatively, the local frequency generator 350 may be tuneable for outputting an adjustable local frequency.

Even though not illustrated in FIG. 3, the first signal output terminal 311 may be connected with a first frequency mixer. In the same way, the second signal output terminal 312 may be connected with a second frequency mixer. The first and the second frequency mixer may be provided with local frequencies from a common frequency generator or from two separate frequency generators. In this way, the frequency of the analogue signals output on the respective signal output terminals 311, 312 may be mixed up to other frequency ranges.

For sake of clarity in the following description of the method based in FIGS. 4 and 5 the reference signs used above in the description of apparatus based FIGS. 1-3 will be maintained.

FIG. 4 shows a block diagram of a signal receiving method.

The signal receiving method may comprise a step S1 of setting up a first operation mode or a second operation mode of a signal receiving apparatus 100, 200.

In the first operation mode, the method may further perform a step S2 of providing a first analogue signal to a first analogue to digital converter 131, 231 by a first switch 121, 221, and a step S3 of providing a second analogue signal to a second analogue to digital converter 132, 232 by second switch 122, 222. Further, the method may perform in the first operation mode a step S4 of converting the first analogue signal to a first digital signal, e.g. by the first analogue to digital converter 131, 231, and a step S5 of converting the second analogue signal to a second digital signal by the second analogue to digital converter 132, 232.

In the second operation mode, the method may perform a step S6 of demodulating a third analogue signal to an in-phase signal and a quadrature signal by an I-Q-demodulator 140, 240). Based on the demodulated in-phase and quadrature signal, the method provides in step S7 the in-phase signal to the first analogue to digital converter 131, 231 by the first switch 121, 221, and provides in step S8 the quadrature signal to a second analogue to digital converter 132, 232 by the second switch 122, 222. Further, the method converts in step S9 the in-phase signal to a third digital signal by the first analogue to digital converter 131, 231, and converts in step S10 the quadrature signal to a fourth digital signal by the second analogue to digital converter 132, 232.

The method may comprise a step of processing the first digital signal and the second digital signal separately by a signal processor 260 in the first operation mode. Further, the method may comprise a step of combining the third digital signal and the fourth digital signal by the signal processor 260 in the second operation mode.

In the signal receiving method, a same sampling rate may be applied for converting the in-phase signal and the quadrature signal in the second operation mode. The first analogue to digital converter 131, 231 and the second analogue to digital converter 132, 232 may be synchronized with each other.

The method may further comprise a step of providing a local frequency to the I-Q-demodulator 140, 240. The in-phase signal and the quadrature signal may be provided based on the provided local frequency.

Figure 5:
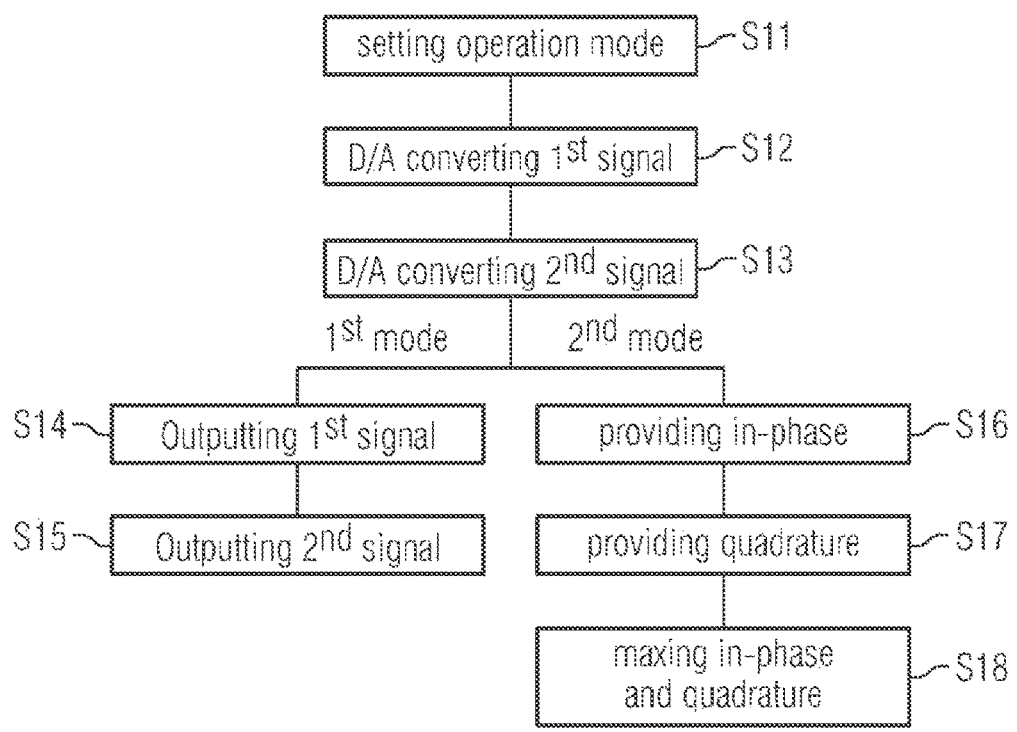
FIG. 5 shows a block diagram of an embodiment of a signal generating method according to the present invention.

FIG. 5 shows a block diagram of a signal generating method.

The signal generating method may set up in a step S11 a first operation mode or a second operation mode. Further, the method converts in a step S12 a first digital signal to a first analogue signal. The conversion may be performed by a first digital to analog converter 331. The method further converts in step S13 a second digital signal to a second analogue signal. This conversion may be performed by a second digital to analog converter 332.

In the first operation mode, the first analogue signal is output in step S14, and the second analogue signal is output in step S15.

In the second operation mode the method comprises a step S16 of providing the first analogue signal to an in-phase input of an I-Q modulator, for instance by the first switch 321, and a step S17 of providing the second analogue signal to a quadrature input of an I-Q modulator 340, for instance by the second switch 322. Finally, the in-phase signal and the quadrature signal are mixed together in step S18, for instance by the I-Q-modulator 340 and the mixed signal are output.

The method may further comprise a step of providing the first digital signal to the first digital to analog converter (331) and a second digital signal to the second digital to analogue converter 332 in the second operation mode. The first digital signal may be an in-phase component of a signal to be outputted, and the second digital signal may be a quadrature component of the signal to be outputted.

The first digital to analogue converter 331 and the second digital to analog converter 332 may be synchronized with each other.

The method may further comprise a step of providing a local frequency to the I-Q-modulator 340, for instance by a local oscillator. The I-Q-modulator 340 may modulate the in-phase signal and the quadrature signal based on the provided local frequency.

Summarizing, the present invention relates to receiving and generating of broadband radio-frequency signals. The present invention provides two alternative operation modes. In a first operation mode are processed separately. In a second operation mode, a single signal is separated in an in-phase component and a quadrature component, and the in-phase component and the quadrature component are processed separately.

Even though in the foregoing the signal receiving and the signal generating are described by separate apparatuses, namely signal receiving apparatus 100, 200 and a signal generating apparatus 300, the signal receiving and the signal generating may be also applied by a single, bidirectional apparatus. In this case, the I-Q-demodulator 140, 240 and the I-Q-modulator 340 may be combined to a single modulator/demodulator. Furthermore, the analogue to digital converters and the digital to analog converters may be equipped as bidirectional converters, or an analogue to digital converter and digital to analog converter may be arranged in parallel, respectively.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS

100, 200 signal receiving apparatus
111, 112, 113,
211, 212, 213 signal input terminals
121, 122, 221, 222 switches
131, 132, 231, 232 analogue to digital converters
140, 240 I-Q-demodulator
241, 242 mixer
250, 251, 252 local frequency generators
260 signal processor
300 signal generating apparatus
311, 312, 313 signal output terminals
321, 322 switches
331, 333 digital to analogue converters
340 I-Q-modulator
350 local frequency generator
360 signal processor

The invention claimed is:

1. A signal receiving apparatus, comprising:
a first signal input terminal for receiving a first analogue signal;
a second signal input terminal for receiving a second analogue signal;
a third signal input terminal for receiving a third analogue signal;
a first analogue to digital converter having an analogue input port and a digital output port, the first analogue to digital converter is adapted to convert an analogue signal received at the analogue input port to a digital signal and provide the digital signal to the digital output port;
a second analogue to digital converter having an analogue input port and a digital output port, the second analogue to digital converter is adapted to convert an analogue signal received at the analogue input port to a digital signal and provide the digital signal to the digital output port;
an I-Q-demodulator having an input port, an in-phase output port and an quadrature output port, the I-Q-demodulator is adapted to demodulate a signal received at the input port of the I-Q-demodulator to an in-phase signal and a quadrature signal, and provide the in-phase signal to the in-phase output port and the quadrature signal to the quadrature output port;
a first switch comprising a first input port, a second input port and an output port, wherein the first input port of the first switch is electrically connected to the first signal input port, and the second input port of the first switch is electrically connected to the in-phase-output port of the I-Q-demodulator, and the output port of the first switch is electrically connected to the analogue input port of the first analogue to digital converter; and
a second switch comprising a first input port, a second input port and an output port, wherein the first input port of the second switch is electrically connected to the second signal input port, and the second input port of the second switch is electrically connected to the quadrature-output port of the I-Q-demodulator, and the output port of the second switch is electrically connected to the analogue input port of the second analogue to digital converter;

wherein in a first operation mode of the signal receiving apparatus, the first switch is adapted to electrically connect the first input port of the first switch to the output port of the first switch, and the second switch is adapted to electrically connect the first input port of the second switch to the output port of the second switch, and wherein in a second operation mode of the signal receiving apparatus, the first switch is adapted to electrically connect the second input port of the first switch to the output port of the first switch, and the second switch is adapted to electrically connect the second input port of the second switch to the output port of the second switch.

2. The signal receiving apparatus according to claim 1, comprising a signal processor for processing the digital output of the first analogue to digital converter and the digital output of the second analogue to digital converter separately in the first operation mode of the signal receiving apparatus and for combining the digital output of the first analogue to digital converter and the digital output of the second analogue to digital converter in the second operation mode of the signal receiving apparatus.

3. The signal receiving apparatus according to claim 1, wherein a same sampling rate is applied to the first analogue to digital converter and the second analogue to digital converter in the second operation mode of the signal receiving apparatus, and wherein the sampling of the first of the digital converter and the second analogue to digital converter are synchronized with each other.

4. The signal receiving apparatus according to claim 1, comprising a local oscillator for providing a local frequency to the I-Q-demodulator, wherein the I-Q-demodulator is adapted to demodulate the signal received at the input port of the I-Q-demodulator based on the provided local frequency.

5. The signal receiving apparatus according to claim 1, comprising a first frequency mixer for mixing a first radio frequency signal at a first local frequency and outputting the mixed signal to the first signal input terminal; and a second frequency mixer for mixing a second radio frequency signal at a second local frequency and outputting the mixed signal to the second signal input terminal.

6. A signal receiving method, comprising the steps of:
setting up a first operation mode or a second operation mode;
providing a first analogue signal to a first analogue to digital converter by a first switch in the first operation mode;
providing a second analogue signal to a second analogue to digital converter by second switch in the first operation mode;
converting the first analogue signal to a first digital signal by the first analogue to digital converter in the first operation mode; and
converting the second analogue signal to a second digital signal by the second analogue to digital converter in the first operation mode; or
demodulating a third analogue signal to an in-phase signal and a quadrature signal by an I-Q-demodulator in the second operation mode;

providing the in-phase signal to the first analogue to digital converter by the first switch in the second operation mode;
providing the quadrature signal to a second analogue to digital converter by second switch in the second operation mode;
converting the in-phase signal to a third digital signal by the first analogue to digital converter in the second operation mode; and
converting the quadrature signal to a fourth digital signal by the second analogue to digital converter in the second operation mode.

7. The signal receiving method according to claim 6, comprising the steps of:
processing the first digital signal and the second digital signal separately by a signal processor in the first operation mode; or
combining the third digital signal and the fourth digital signal by the signal processor in the second operation mode.

8. The signal receiving method according to claim 6, where a same sampling rate is applied for converting the in-phase signal and the quadrature signal in the second operation mode, and wherein the first analogue to digital converter and the second analogue to digital converter are synchronized with each other.

9. The signal receiving method according to claim 6, comprising the step of providing a local frequency to the I-Q-demodulator, wherein the in-phase signal and the quadrature signal are provided based on the provided local frequency.

10. The signal receiving method according to claim 6, comprising the steps of:
mixing a first radio frequency signal with the first local frequency to obtain the first analogue signal in the first operation mode; and
mixing a second radio frequency signal with a second local frequency to obtain the second analogue signal in the first operation mode.

11. A signal generating apparatus, comprising:
a first signal output terminal;
a second signal output terminal;
a third signal output terminal;
a first digital to analogue converter having a first digital input port and an analogue output port, the first digital to analogue converter is adapted to convert a digital signal received at the digital input port of the first digital to analogue converter to a first analogue signal and provide the first analogue signal to the analogue output port of the first digital to analogue converter;
a second digital to analogue converter having a digital input port and an analogue output port, the second digital to analogue converter is adapted to convert a digital signal received at the digital input port of the second digital to analogue converter to a second analogue signal and provide the second analogue signal to the second analogue output port of the second digital to analogue converter;
an I-Q-modulator having an in-phase input port for receiving an analogue in-phase signal, an quadrature input port for receiving and analogue quadrature signal, and an output port electrically connected to the first signal output port, wherein the I-Q-modulator is adapted to combine the received in-phase signal and received quadrature signal and provide the combined signal to the output terminal;

a first switch comprising an input port, a first output port and a second output port, wherein the input port of the first switch is electrically connected to the analogue output port of the first digital to analogue converter, the first output port of the first switch is electrically connected to the first signal output terminal, and the second output port of the first switch is electrically connected to the in-phase-input port of the I-Q-modulator; and a second switch comprising an input port, a first output port and a second output port, wherein the input port of the second switch is electrically connected to the analogue output port of the second digital to analogue converter, the first output port of the second switch is electrically connected to the second signal output terminal, and the second output port of the second switch is electrically connected to the quadrature port of the I-Q-modulator;

wherein in a first operation mode of the signal generating apparatus, the first switch is adapted to electrically connect the input port of the first switch to the first output port of the first switch, and the second switch is adapted to electrically connect the input port of the second switch to the first output port of the second switch, and wherein in a second operation mode of the signal generating apparatus, the first switch is adapted to electrically connect the input port of the first switch to the second output port of the first switch, and the second switch is adapted to electrically connect the input port of the second switch to the second output port of the second switch.

12. The signal generating apparatus according to claim 11, comprising a signal processor for providing a first digital signal to the first digital to analogue converter and a second digital signal to the second digital to analogue converter, wherein in the second operation mode of the signal generating apparatus, the first digital signal is an in-phase-component of a signal to be outputted, and the second digital signal is a quadrature component of the signal to be outputted.

13. The signal generating apparatus according to claim 11, wherein the first digital to analogue converter and the second digital to analogue converter are synchronized with each other.

14. The signal generating apparatus according to claim 11, comprising a local oscillator for providing a local frequency to the I-Q-modulator, wherein the I-Q-modulator is adapted to modulate the signals received at the in-phase port and the quadrature port of the I-Q-modulator based on the provided local frequency.

15. A signal generating method, comprising the steps of:
setting up a first operation mode or a second operation mode;
converting a first digital signal to a first analogue signal by a first digital to analog converter;
converting a second digital signal to a second analogue signal by a second digital to analog converter;
outputting the first analogue signal by a first switch in the first operation mode;
outputting the second analogue signal by a second switch in the first operation mode;
providing the first analogue signal to an in-phase input of an I-Q modulator by the first switch in the second operation mode;
providing the second analogue signal to a quadrature input of an I-Q modulator by the second switch in the second operation mode;
mixing the in-phase signal and the quadrature signal by the I-Q-modulator and outputting the mixed signal in the second operation mode.

16. The signal generating method according to claim 15, comprising a step of providing the first digital signal to the first digital to analog converter and a second digital signal to the second digital to analogue converter in the second operation mode, wherein the first digital signal is an in-phase-component of a signal to be outputted, and the second digital signal is a quadrature component of the signal to be outputted.

17. The signal generating method according to claim 16, wherein the first digital to analogue converter and the second digital to analog converter are synchronized with each other.

18. The signal generating apparatus according to claim 17, comprising a step of providing a local frequency to the I-Q-modulator by a local oscillator, wherein the I-Q-modulator modulates the in-phase signal and the quadrature signal based on the provided local frequency.

* * * * *